United States Patent [19]
Okamoto

[11] Patent Number: 5,554,266
[45] Date of Patent: Sep. 10, 1996

[54] SEMICONDUCTOR DEVICE MANUFACTURING APPARATUS

[75] Inventor: Rintarou Okamoto, Kitakyushu, Japan

[73] Assignee: Kabushiki Kaisha Toshiba, Kawasaki, Japan

[21] Appl. No.: 460,068

[22] Filed: Jun. 2, 1995

Related U.S. Application Data

[63] Continuation of Ser. No. 231,709, Apr. 22, 1994, abandoned.

[30] Foreign Application Priority Data

Apr. 23, 1993 [JP] Japan ................................. 5-096396

[51] Int. Cl.$^6$ ................................................. C23C 14/34
[52] U.S. Cl. .............................. 204/298.15; 204/298.06; 204/298.19; 204/298.34; 204/298.37; 156/345
[58] Field of Search ................. 204/298.06, 298.14, 204/298.37, 298.15, 298.16, 298.19, 298.34, 298.08; 156/345

[56] References Cited

U.S. PATENT DOCUMENTS

| | | | |
|---|---|---|---|
| 4,473,455 | 9/1984 | Dean et al. ......................... | 204/298.15 |
| 4,756,810 | 7/1988 | Lamont, Jr. et al. ........... | 204/298.06 X |
| 4,871,433 | 10/1989 | Wagner et al. ................. | 204/298.06 X |
| 4,874,494 | 10/1989 | Ohmi ............................. | 204/298.06 X |
| 4,897,171 | 1/1990 | Ohmi ................................ | 204/298.15 |
| 4,999,096 | 3/1991 | Niher et al. ..................... | 204/298.06 X |
| 5,057,185 | 10/1991 | Thomas, III et al. ......... | 204/298.06 X |

*Primary Examiner*—Nam Nguyen
*Attorney, Agent, or Firm*—Foley & Lardner

[57] ABSTRACT

In a semiconductor device manufacturing apparatus having a holder for holding a semiconductor wafer to be processed within a reaction vessel, the holder is provided with a separator for preventing ends of the semiconductor wafer from being brought into contact with the holder. Further, in a semiconductor device manufacturing apparatus having a holder functioning as a cathode, for holding a semiconductor wafer to be processed; an anode provided on the semiconductor wafer side so as to be opposed to the holder; a plurality of magnets arranged in the vicinity of the anode, for generating magnetic force lines on a surface of the anode; and a section for applying a high voltage between the anode and the cathode to generate an electric field so that plasma can be generated at intersectional portions between the generated magnetic force lines and the generated electric field, the apparatus further includes a separator provided for the holder, for preventing ends of the semiconductor wafer to be processed from being brought into contact with the holder. The separator provided for the holder is a stepped portion or a recessed portion formed on the holder.

2 Claims, 2 Drawing Sheets

SEMICONDUCTOR DEVICE MANUFACTURING APPARATUS

This application is a continuation, of application Ser. No. 08/231,709, flied Apr. 22, 1994, abondoned.

BACKGROUND OF THE INVENTION

1. Field of the Invention

The present invention relates to a semiconductor device manufacturing apparatus, and more suitably applied to a bias sputtering apparatus for performing thin film sputtering process and etching process simultaneously.

2. Description of the Prior Art

Manufacturing apparatuses of various kinds are now being used to form semiconductor devices on a semiconductor wafer. As one of these apparatuses, a bias sputtering apparatus is known. This bias sputtering apparatus has been developed to improve an insufficient step coverage at the stepped (profile) portions of deposited films formed in accordance with the ordinary sputtering process. The primary object of use of this bias sputtering apparatus is to planarize the thin films.

In this bias sputtering apparatus, a planar magnetron or a diode cathode is used to apply a bias voltage to the semiconductor substrate. In the case of planar magnetron, two matching boxes are arranged on the upper and lower sides of a reaction vessel. The two matching boxes are connected to a high frequency power source. That is, the two matching boxes are connected to two amplifiers separately, and further connected to an exciter (13.56 Mhz) in common.

Within the reaction vessel, the support base is rotatably attached to an axle electrically connected to the lower matching box. The support base is placed within the reaction vessel. The holder plate is mounted on the support base, and the semiconductor wafer to be processed is placed on the holder plate.

Further, within the reaction vessel, a flat target electrode (an anode) composed of a planar magnetron is provided and is electrically connected to the upper matching box. A plurality of annular magnets are further arranged within the reaction vessel, in contact with the reverse side of the flat target electrode.

Further, within the reaction vessel, a water cooling mechanism and a shield electrode are both provided. In this bias sputtering apparatus, the semiconductor wafer to be processed is mounted on the holder plate (which functions as a cathode) being kept a predetermined distance away from the flat target electrode (which functions as an anode).

When a voltage of several hundred volts is applied between the target electrode (anode) and the holder plate (cathode) for electric discharge, the lines of magnetic force generated from the magnets go out of the surface of the target electrode and come to the surface of the same target electrode again in such a way that the magnetic force lines surround the surface of the flat target electrode. Therefore, electrons are ionized by the discharge and moved as with the case of a magnetron at the intersectional portions between the magnetic field and the electric field, so that a high density plasma can be generated.

In the bias sputtering apparatus as described above, since the film deposition process and the etching process both progress simultaneously, and further since high frequency power is applied between the holder plate (which functions as a cathode) and the target electrode (which functions as an anode), a film deposited on the semiconductor wafer grows and simultaneously the re-sputtering occurs from the bottom of the stepped portions formed on the semiconductor wafer to the side walls or the corner portions of the semiconductor wafer, so that all over the surface of the semiconductor wafer can be planarized.

Accordingly, this bias sputtering apparatus can be adopted not only to form a metallic wiring film but also to form an interlayer insulating film for a multi-wiring layer and a multilayer (three or more) wiring layer itself.

FIG. 1 is a cross-sectional view showing the support base 2 placed within the reaction vessel (not shown) of the bias sputtering apparatus. FIG. 2 is an enlarged cross-sectional view of FIG. 1. On this support base 2, an alumina holder plate 3 is mounted, and further a semiconductor wafer 1 to be processed is mounted on the alumina holder plate 3. Further, a heating source (not shown) is provided just under the support base 2 to heat the semiconductor wafer 1 to be processed up to a predetermined temperature.

In the bias sputtering apparatus as described above, the holer plate 3 for holding the semiconductor wafer 1 is functioned as a cathode. Further, the size of the holder plate 3 is usually determined to be relatively large to suppress the dispersion in the etching process performed simultaneously with the thin film sputtering process.

FIG. 2 shows the status where the semiconductor wafer 1 to be processes is covered with a deposited film 4. In this case, however, since the dimensions of the alumina holder plate 3 for holding the semiconductor wafer 1 is determined to be larger than that of the semiconductor wafer 1 to be processed, not only the semiconductor wafer 1 but also the holder plate 3 are inevitably covered with the deposited film 4.

On the other hand, in the bias sputtering apparatus as described above, since the thin film is deposited all over the semiconductor wafer 1 to be processed and in addition on the holder plate 3, in case cracks are produced at the end portions of the deposited thin films when the processed semiconductor wafers are being conveyed, there arises a problem in that micro-particles inside the thin film are scattered onto the wafer surface as dust, thus deteriorating the characteristics of the semiconductor devices.

SUMMARY OF THE INVENTION

Accordingly, the object of the present invention is to provide an apparatus for manufacturing semiconductor devices, by which it is possible to prevent cracks from being produced in the semiconductor thin film deposited on the semiconductor wafer when the semiconductor wafers are being conveyed.

To achieve the above-mentioned object, the present invention provides a semiconductor device manufacturing apparatus having a holder for holding a semiconductor wafer to be processed within a reaction vessel, wherein the holder is provided with a separator for preventing ends of the semiconductor wafer from being brought into contact with the holder.

Further, the present invention provides a semiconductor device manufacturing apparatus, comprising: a holder functioning as a cathode, for holding a semiconductor wafer to be processed; an anode provided on the semiconductor wafer side so as to be opposed to said holder; a plurality of magnets arranged in the vicinity of said anode, for generating magnetic force lines on a surface of said anode; and means for applying a high voltage between said anode and said cathode to generate an electric field so that plasma can be generated at intersectional portions between the generated magnetic force lines and the generated electric field, wherein said holder is provided with a separator for preventing ends of the semiconductor wafer to be processed from being brought into contact with said holder. The separator provided for said holder is a stepped portion or a recessed portion formed on said holder.

DETAILED DESCRIPTION OF THE EMBODIMENTS

The semiconductor device manufacturing apparatus according to the present invention will be described hereinbelow with reference to the attached drawings.

Figure 1:
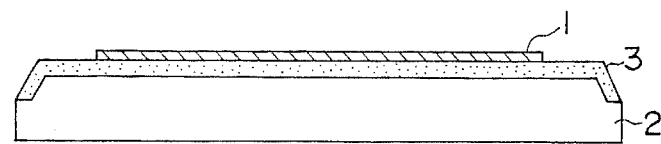
FIG. 1 is a cross-sectional view showing an essential portion of a conventional semiconductor device manufacturing apparatus.
Figure 2:
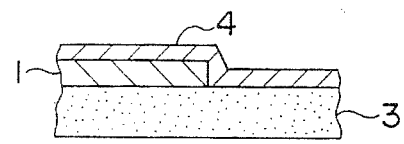
FIG. 2 is an enlarged cross-sectional view showing the same shown in FIG. 1.
Figure 3:
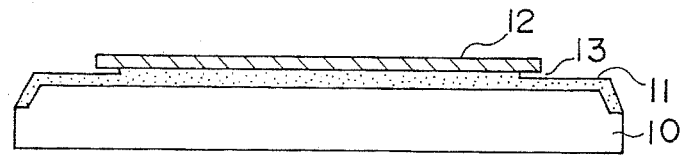
FIG. 3 is a cross-sectional view showing the essential portion of the semiconductor device manufacturing apparatus according to the present invention.

FIG. 3 shows only the essential portion of the semiconductor device manufacturing apparatus. In FIG. 3, a support base 10 is attached to a rotating axle (not shown) disposed at roughly the central position of a reaction vessel (not shown). Further, a holder plate 11 is fixed to this support base 10. The holder plate 11 is formed of $Al_2O_3$ and with holes (not shown) for heat deformation absorption and easy conveyance. Further, a heating source (not shown) is provided under the support base 10.

Figure 4:
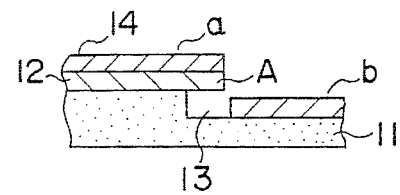
FIG. 4 is an enlarged cross-sectional view showing the same shown in FIG. 3.

As shown in FIG. 3 and as depicted in FIG. 4 in more detail, a stepped (level-difference) portion 13 is formed between the end portion A of the semiconductor wafer 12 to be processed and the holder plate 11, to prevent the wafer 12 from being brought into direct contact with the holder plate 11. Owing to the presence of this stepped portion 13, the end portion A of the semiconductor wafer 12 to be processed is kept away from the $Al_2O_3$ holder plate 11. Accordingly, a deposited thin film 14 is divided into a portion deposited onto the semiconductor wafer 12 to be processed and another portion deposited onto the stepped portion 13 of the holder plate 11, respectively.

Accordingly, since the thin film a deposited on the end surface A of the semiconductor wafer 12 to be processed is kept upward away from the thin film a deposited on the stepped portion 13 formed on the holder plate 11, when the semiconductor wafer 11 is being conveyed, it is possible to prevent cracks from being produced at the edge of the deposited thin film 14, with the result that it is possible to reduce dust, as compared with the case of the conventional manufacturing apparatus.

Figure 5:
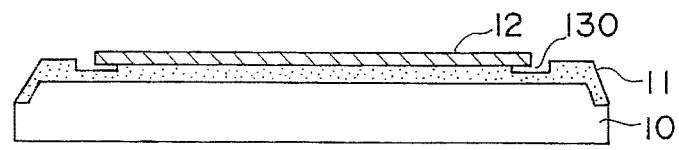
FIG. 5 is a cross-sectional view showing a modification of the essential portion of the semiconductor device manufacturing apparatus shown in FIG. 3.
Figure 6:
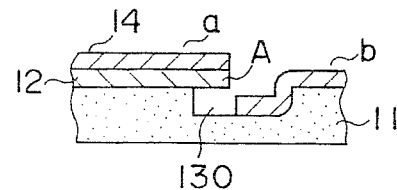
FIG. 6 is an enlarged cross-sectional view showing the same shown in FIG. 5.

Further, it is also possible to obtain the same effect when a recessed portion 130 is formed between the end portion of the semiconductor wafer 12 and the holder plate 11, instead of the stepped portion 13, as depicted in FIGS. 5 and 6.

Figure 7:
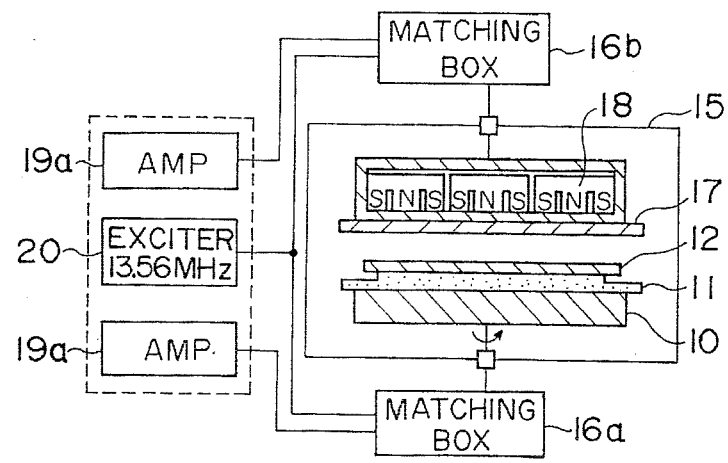
FIG. 7 is a diagrammatic view and schematic block diagram showing the bias sputtering apparatus according to the present invention.

FIG. 7 shows a bias sputtering apparatus provided with the holder plate 11 as described above. This apparatus is effective to improve an insufficient step coverage caused at the stepped portion of a thin film deposited during the sputtering process; that is, to planarize the thin film. In this apparatus, a planar magnetron or a diode cathode is used to apply a bias voltage to the holer plate 11.

In more detail, two matching boxes 16a and 16b are arranged on the upper and lower sides of a reaction vessel 15. The two matching boxes 16 are connected to a high frequency power source. That is, the two matching boxes 16 are connected to two amplifiers 19a and 19b separately, and further connected to an exciter 20 (13.56 MHz) in common. Further, the support base 10 is rotatably attached to an axle electrically connected to the lower matching box 16a. The support base 10 is placed within the reaction vessel 15. The holder plate 11 is mounted on the support base 10, and the semiconductor wafer 12 to be processed is mounted on the holder plate 11.

On the other hand, a flat target electrode (an anode) 17 composed of a planar magnetron is electrically connected to the upper matching box 16b. Further, a plurality of annular magnets 18 are arranged in contact with the reverse side of the flat target electrode 17.

Figure 8:
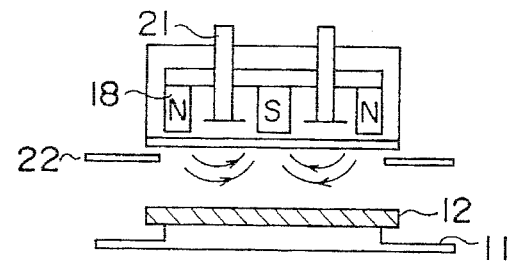
FIG. 8 is an enlarged cross-sectional view showing the same shown in FIG. 7.

As depicted in more detail in FIG. 8, within the reaction vessel 15, a water cooling mechanism 21 and a shield electrode 22 are further provided. In this bias sputtering apparatus, the semiconductor wafer 12 to be processed is mounted on the holder plate 11 (which functions as a cathode) being kept a predetermined distance away from the flat target electrode 17 (which functions as an anode).

When a voltage of several hundred volts is applied between the target electrode (anode) 17 and the holder plate (cathode) 11 for discharge, as shown in FIG. 8, the lines of magnetic force generated from the magnets 18 go out of the surface of the target electrode 17 and come into the surface of the same target electrode 17 again in such a way that the magnetic force lines surround the surface of the flat target electrode 17. Therefore, electrons are ionized by the discharge and moved as with the case of a magnetron at the intersectional portions between the magnetic field and the electric field, so that a high density plasma can be generated.

In the bias sputtering apparatus as described above, since the film deposition process and the etching process both progress simultaneously, and further since high frequency power is applied between the holder plate 11 (which functions as a cathode) and the target electrode 17 (which functions as an anode), a film deposited on the semiconductor wafer is grown and simultaneously the re-sputtering occurs from the bottom of the stepped portions (formed by an insulating layer or a wiring layer (both not shown) formed on the semiconductor wafer to be processed) to the side walls or the corner portions of the semiconductor wafer, so that all over the surface of the semiconductor wafer is planarized.

Accordingly, this bias sputtering apparatus can be adopted not only to form a metallic wiring film but also to form an interlayer insulating film for a multi-wiring layer and a multilayer (three or more) wiring layer itself.

Figure 9:
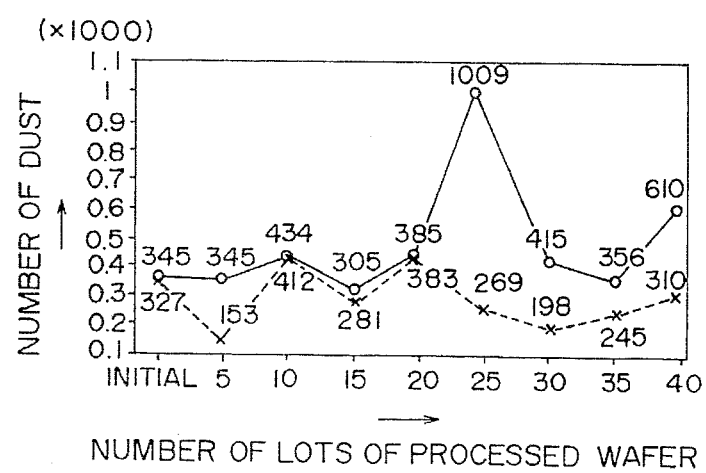
FIG. 9 is a graphical representation showing the dust occurrence rate in the semiconductor device manufacturing apparatus according to the present invention, in comparison with that of the conventional apparatus.

FIG. 9 shows the occurrence of dust in the bias sputtering apparatus according to the present invention, in comparison with the conventional apparatus, in which dashed lines indicate that of the present invention and solid lines indicate that of the conventional apparatus. In FIG. 9, the abscissa designates the numbers of lots of the deposition-processed wafers and the ordinate designates the pieces of dust particles (whose diameter is more than 0.3 micron) on a single wafer. The dust particles were examined by a wafer dust inspecting apparatus, by which the wafers were scanned by a laser to check the reflection status of the scanning laser.

FIG. 9 indicates that in the case of the bias sputtering apparatus according to the present invention, it is possible to reduce the dust roughly uniformly, irrespective to the lot numbers, as compared with the conventional apparatus.

As described above, in the semiconductor device manufacturing apparatus according to the present invention, since the thin film deposited on the end portion of the semiconductor wafer to be processed can be kept upward away from the holder plate by the presence of the stepped portion (height difference) formed on the holder plate, when the semiconductor wafer to be processed is conveyed, it is possible to prevent the occurrence of cracks at the end portion of the thin film formed on the semiconductor wafer and thereby to reduce the dust, as compared with the conventional apparatus.

What is claimed is:

1. A semiconductor device manufacturing apparatus for processing a semiconductor wafer housed in a reaction vessel, the apparatus comprising:

a support base with a substantially flat surface;

an insulative holding member disposed on top of and extending an entire length of the substantially flat surface of the support base, for holding the semiconductor wafer, the support base and the insulative holding member being housed in the reaction vessel, wherein an area of the insulative holding member facing the semiconductor wafer is larger than an area of the semiconductor wafer and the insulative holding member is provided with a stepped portion for preventing ends of the semiconductor wafer from being brought into contact with the insulative holding member, and wherein the portion of the support base facing the semiconductor wafer is substantially level.

2. A semiconductor device manufacturing apparatus for processing a semiconductor wafer housed in a reaction vessel, the apparatus comprising:

a support base with a substantially flat surface functioning as a cathode;

an insulative holding member disposed on top of and extending an entire length of the substantially flat surface of the support base, for holding the semiconductor wafer, the support base and the insulative holding member being housed in the reaction vessel;

an anode provided on the semiconductor wafer side so as to be opposed to the holding member;

a plurality of magnets arranged in the vicinity of the anode, for generating magnetic force on a surface of the anode, the support base and the insulating holding member, the anode and the magnets being housed in the reaction vessel; and means for applying a high voltage between the anode and the cathode to generate an electric field so that plasma can be generated at intersectional portions between the generated magnetic force and the generated electric field, wherein an area of the insulative holding member facing the semiconductor wafer is larger than an area of the semiconductor wafer and the insulative holding member is provided with a stepped portion for preventing ends of the semiconductor wafer from being brought into contact with the insulative holding member, and wherein the portion of the support base facing the semiconductor wafer is substantially level.

* * * * *